United States Patent [19]
Ho et al.

[11] Patent Number: 6,089,915
[45] Date of Patent: Jul. 18, 2000

[54] ADAPTER FOR CONNECTING A CARD CONNECTOR TO A PRINTED CIRCUIT BOARD

[75] Inventors: Yu-Ming Ho, Pen-Chiao; Ming-Chung Lai, Shin-Juang, both of Taiwan

[73] Assignee: Hon Hai Parecision Ind. Co., Ltd., Taipei Hsien, Taiwan

[21] Appl. No.: 09/119,371

[22] Filed: Jul. 20, 1998

[30] Foreign Application Priority Data

Sep. 25, 1997 [TW] Taiwan .................................. 86216458

[51] Int. Cl.⁷ .................................................. H01R 13/658
[52] U.S. Cl. ........................... 439/607; 439/108; 439/609
[58] Field of Search .................................. 439/607–610, 439/95, 108, 79

[56] References Cited

U.S. PATENT DOCUMENTS

| | | | |
|---|---|---|---|
| 5,399,105 | 3/1995 | Kaufman et al. | 439/609 |
| 5,478,260 | 12/1995 | Kaufman et al. | 439/609 |
| 5,637,014 | 6/1997 | Sukegawa et al. | 439/609 |
| 5,725,385 | 3/1998 | Takano et al. | 439/79 |
| 5,795,190 | 8/1998 | Ouo | 439/607 |
| 5,890,917 | 4/1999 | Ishida et al. | 439/609 |

*Primary Examiner*—Hien Vu

[57] ABSTRACT

An adapter for connecting a card connector to a mother board consists of a dielectric housing having a front face proximate the card connector and a bottom face proximate the mother board, and a metallic shielding covering a top face, a rear face and side walls of the housing. A number of contacts are fixedly received in the housing and extend from the front face to the bottom face. The contacts are electrically engaged with contacts of the card connector. A top portion of the shielding is engaged with a shielding of the card connector. The shielding of the adapter further forms a plurality of grounding tabs extending between tail portions of selected contacts of the adapter, thereby reducing crosstalk therebetween.

5 Claims, 3 Drawing Sheets

ADAPTER FOR CONNECTING A CARD CONNECTOR TO A PRINTED CIRCUIT BOARD

BACKGROUND OF THE INVENTION

1. Field of The Invention

The present invention relates to an adapter, and particularly to an adapter for connecting a card connector such as a PCMCIA connector to a printed circuit board, which has an improved EMI/RFI shielding and cross-talk reduction effectiveness.

2. The Prior Art

Following the development of computer and communication technology, high quality and high speed signal transmission are increasingly required. Accordingly, how to reduce EMI/RFI and cross-talk from adversely affecting the operation of an electrical connector becomes an important issue.

Conventionally, a card connector such as a PCMCIA connector has contacts with tail portions bent perpendicular to contact portions thereof and extending through a spacer to be directly soldered to a mother board. Alternatively, the tail portions are extended in line with the contact portions and are soldered to a daughter board perpendicular to the contacts which is inserted into a socket on the mother board to achieve electrical connection of the connector to the mother board. Such prior art is disclosed in Taiwan Patent Application Nos. 84206176, 83218076 and U.S. Pat. Nos. 5,591,036, 5,591,035, 5,399,105, 5,334,046, 5,288,247, 5,195,899, 5,176,523 and 5,057,028.

The tail portions of the contacts of the card connectors disclosed above are not shielded making them susceptible to EMI/RFI (electromagnetic interference/radio frequency interference). Furthermore, cross-talk between signal contacts of the contacts cannot be effectively prevented.

Hence, a device is needed which can eliminate the above mentioned defects of current connectors.

SUMMARY OF THE INVENTION

Accordingly, an objective of the present invention is to provide an adapter for connecting a card connector such as a PCMCIA connector to a mother board whereby a connecting portion between the connector and the mother board is well shielded from EMI/RFI.

Another objective of the present invention is to provide an adapter for connecting a card connector such as a PCMCIA connector to a mother board whereby prevention of cross-talk between signal contacts of the card connector is improved.

To fulfill the above mentioned objectives, according to one embodiment of the present invention, an adapter for connecting a card connector to a mother board consists of a dielectric housing made by plastic injection molding to have a substantially rectangular configuration and defining two rows of contact passageways from a front face to a bottom face thereof, wherein the front face is proximate the card connector and the bottom face is proximate the mother board. A plurality of contacts are fixedly received in the contact passageways. Each contact has a contact portion for engaging with a corresponding contact of the connector, and a tail portion for being soldered to the mother board. A metallic shielding is attached to the housing and covers an upper face, a rear face and lateral sides thereof. The metallic shielding electrically engages with a metallic shielding of the connector. The shielding forms tabs for being soldered to the mother board, which are located between the tail portions of selected signal contacts of the contacts.

DETAILED DESCRIPTION OF THE PREFERRED EMBODIMENT

Reference will now be made in detail to the preferred embodiment of the present invention.

Figure 1:
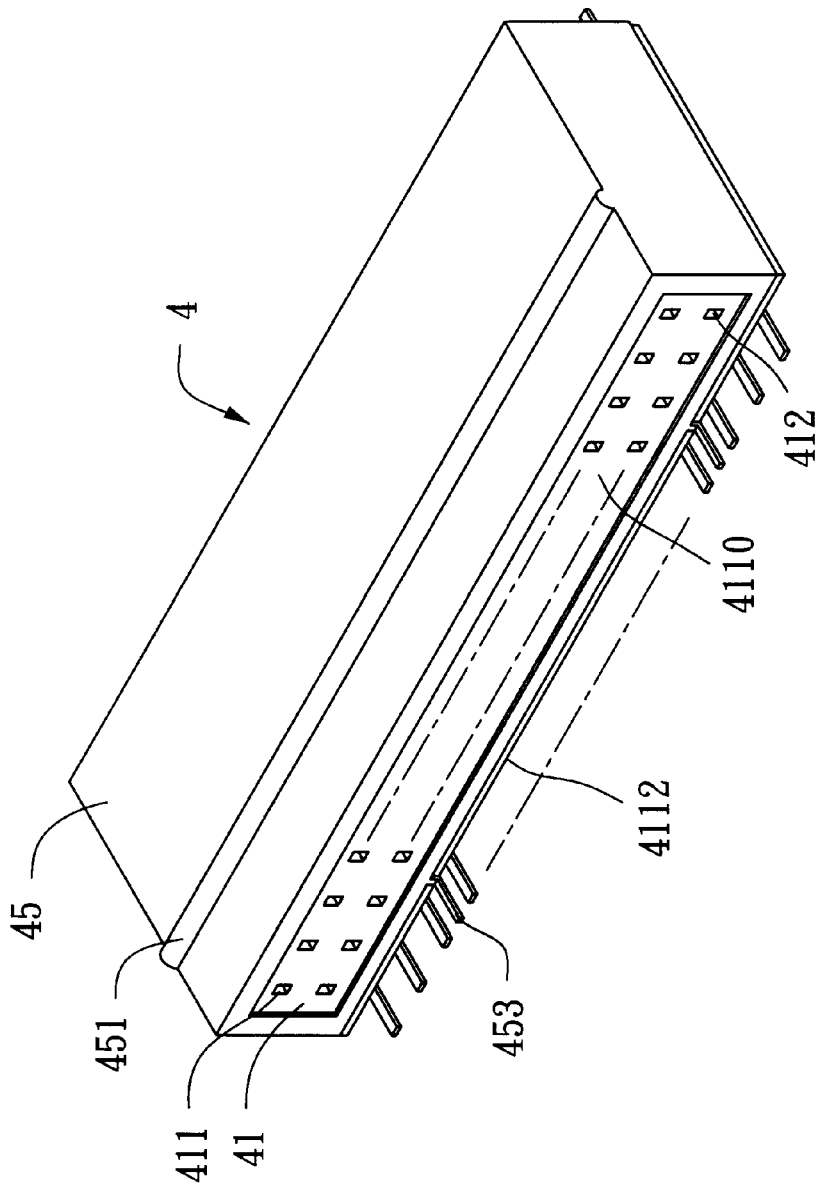
FIG. 1 is a perspective view of an adapter in accordance with the present invention.
Figure 2:
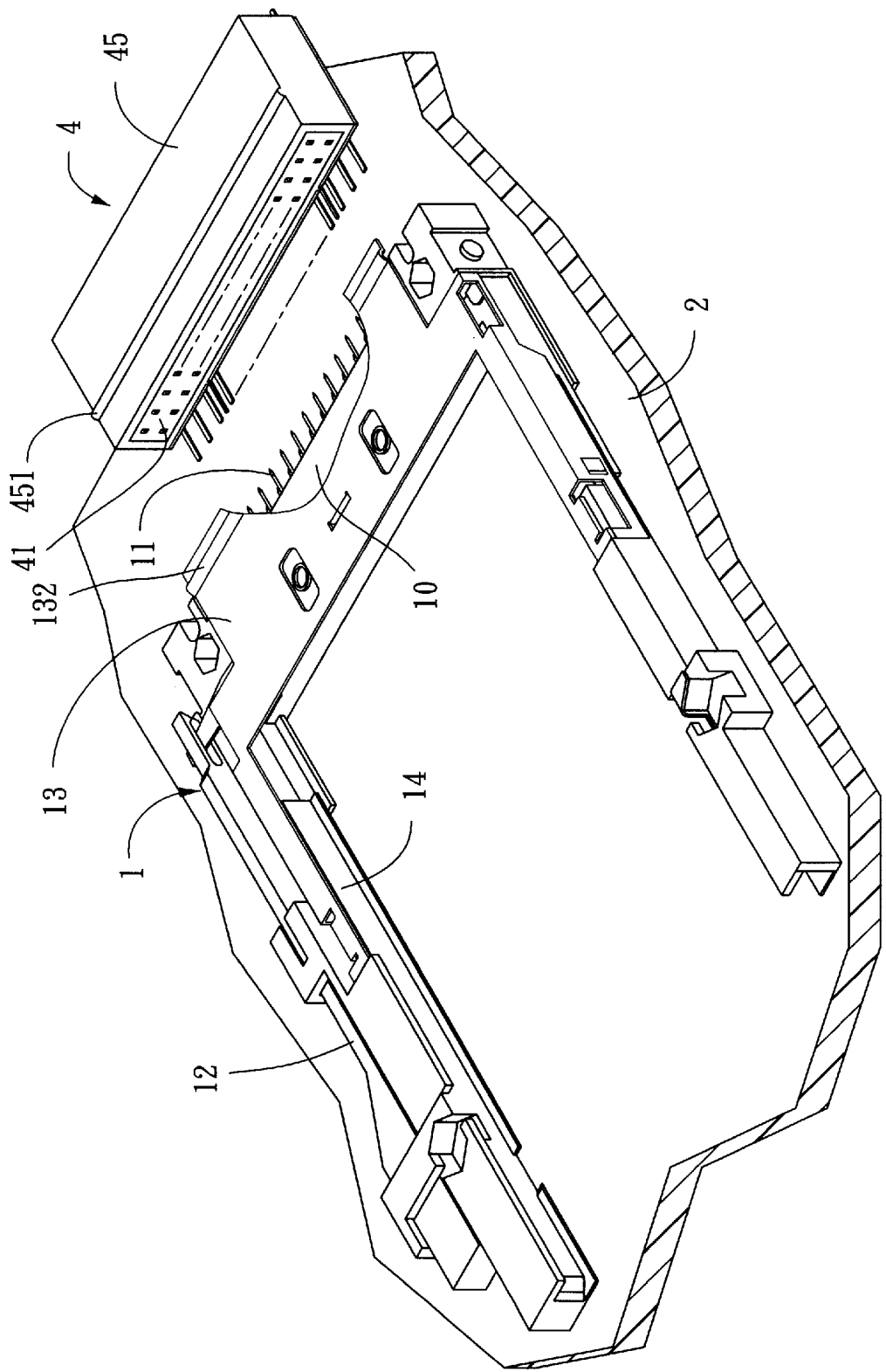
FIG. 2 is a perspective view of the adapter of FIG. 1 and a PCMCIA connector mounted on a printed circuit board.
Figure 3:
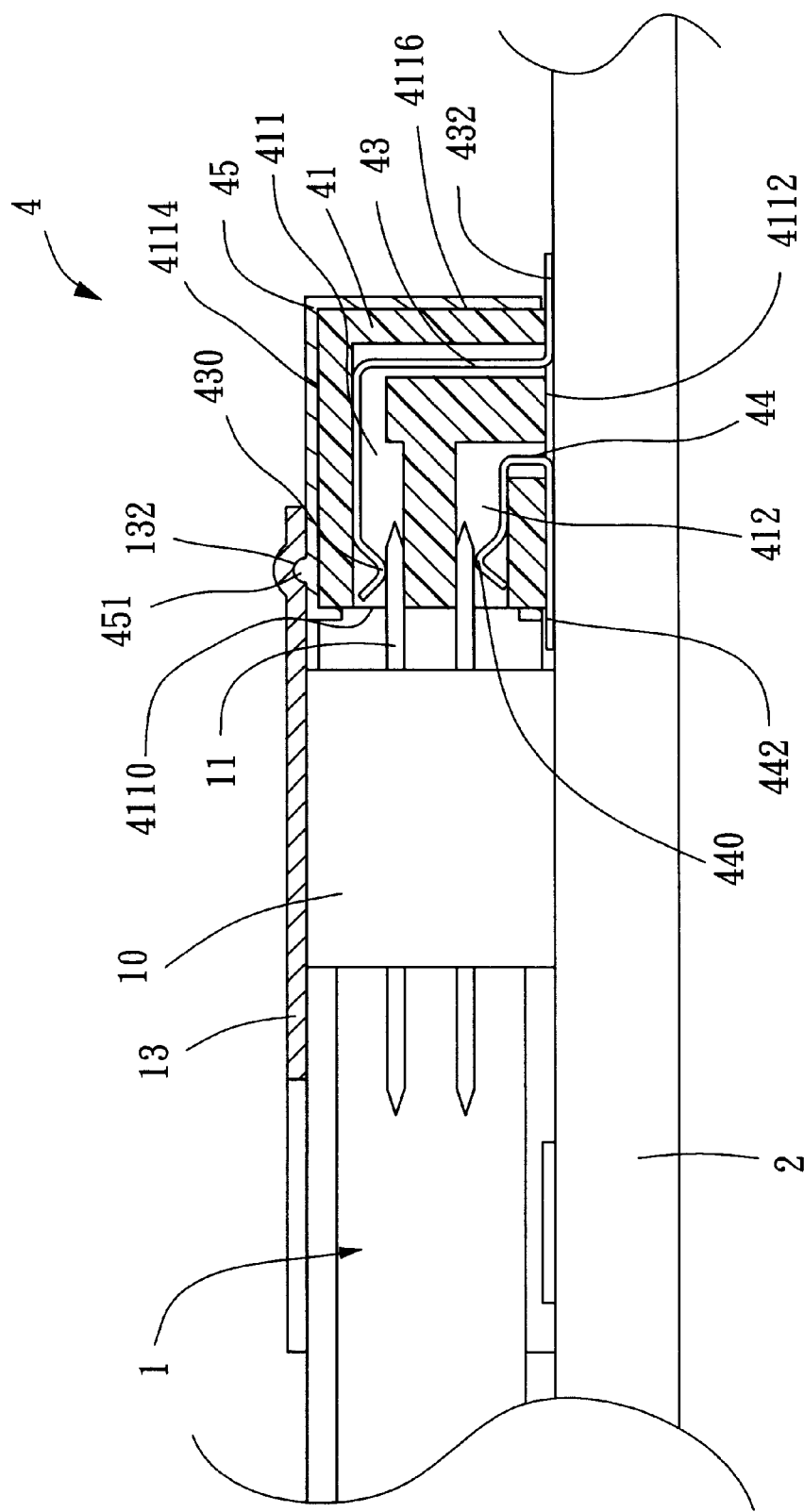
FIG. 3 is a diagrammatic cross-sectional view showing a connection between the PCMCIA connector and the adapter of FIG.

Referring to FIGS. 1 to 3, an adapter 4 in accordance with the present invention electrically connects a card connector 1 to a printed circuit board 2 which usually is a mother board of a computer. The card connector 1 as shown in the preferred embodiment is a PCMCIA connector which includes a housing 10, a plurality of contacts 11 fixed to the housing 10, a metal shielding 13 attached to an upper face of the housing 10, a guiding frame 14 fixed to lateral ends of the housing 10 for guiding a card (not shown) into/out of the connector 1, and an ejector 12 reciprocally and movably mounted to the housing 10 and the frame 14 for ejecting a card inserted into the connector 1. The shielding 13 defines a recess 132 in a bottom face near a rear end thereof.

The adapter 4 consists of an inner rectangular dielectric housing 41 made by plastic injection molding and an outer shielding 45 made by stamping a metal sheet. The shielding 45 covers a top face 4114, a rear face 4116 and lateral sides (not labeled) of the housing 41. The portion of the shielding 45 covering the top face 4114 of the housing 41 forms a ridge 451 protruding upward therefrom. The housing 41 defines upper and lower contact passageways 411, 412 from a front face 4110 to a bottom face 4112 thereof, wherein the front face 4110 is proximate the connector 1 and the bottom face 4112 is proximate the printed circuit board 2. The upper contact passageways 411 are defined in a portion of the housing 41 behind the lower contact passageways 412. An plurality of upper contacts 43 are fixedly received in the upper contact passageways 411. Each upper contact 43 has a contact portion 430 near the front face 4110 of the housing 41 and a tail portion 432 rearwardly extending along the bottom face 4112 and beyond the rear face 4116 of the housing 41. A plurality of lower contacts 44 are fixedly received in the lower contact passageways 412. Each lower contact 44 has a contact portion 440 near the front face 4110 and a tail portion 442 forwardly extending along the bottom face 4112 and beyond the front face 4110. The shielding 45 further forms a plurality of grounding tabs 453 for being soldered to the printed circuit board 2. The grounding tabs 453 extend beyond the front and rear faces 4110, 4116 of the housing 41 and between tail portions 432, 442 of selected signal contacts of the contacts 43, 44, respectively for reducing cross-talk therebetween. Although the extension of the grounding tabs 453 beyond the rear face 4116 of the housing 41 is not shown in the drawings, this can be easily understood by those skilled in the art.

To assemble the adapter 4 and the card connector 1 to the printed circuit board 2, firstly the adapter 4 is fixed to the PCB 2 at a predetermined position by soldering the tail portions 432, 442 of the contacts 43, 44 and the grounding tabs 453 to the PCB 2. Then, the card connector 1 is positioned on the PCB 2 and moved toward the adapter 4 to reach a position as shown in FIG. 3 whereby the contacts 11 of the card connector 1 are inserted into the upper and lower contact passageways 411, 412 to electrically engage with the contact portions 430, 440 of the upper and lower contacts 43, 44, respectively, and the ridge 451 is fittingly received in the recess 132 so that the shieldings 45, 13 are electrically engaged with each other. Thereafter, the card connector 1 is fixed to the PCB 2 by using two screws (not shown) to threadedly fasten the guiding frame 14 to the PCB 2.

The contacts 43, 44 for connecting the contacts 11 of the connector 1 to the PCB 2 are covered by the shielding 45 so that they are protected from EMI/RFI.

Furthermore, the grounding tabs 453 extend between tail portions 432, 442 of selected signal contacts of the contacts 43, 44 of the adapter 4, respectively, whereby cross-talk therebetween can be reduced.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. A card connector system, comprising:
    a card connector having front end for receiving a card, and an adapter located at a rear end of the card connector for engaging with the card connector, the card connector system comprising:
        a first dielectric housing having a bottom face being mounted on a printed circuit board and an upper face opposite the bottom face;
        a plurality of first contacts fixed in the first housing, the first contacts having first contact portions and first tail portions forwardly and rearwardly extending from the first housing, respectively;
        a guiding frame fixed to the front end of the first housing for guiding said card into the connector to electrically connect with the first contact portions of the first contacts; and
        a first metallic shielding attached to the upper face of the first housing; and
        an ejector reciprocally and movably mounted to the frame and the first housing for ejecting said card inserted into the connector;
    the adapter comprising:
        a second dielectric housing having a plurality of contact passageways with a plurality of second contacts received therein, the second contacts having second contact portions electrically engaged with the first tail portions of the first contacts of the card connector and second tail portions for being soldered to the printed circuit board; and
        a second metallic shielding covering the second housing of the adapter and engaged with the first shielding of the card connector for shielding the first tail portions of the first contacts of the card connector, wherein
        the second shielding of the adapter forms a ridge fittingly received in a recess defined in the first shielding of the card connector.

2. The system in accordance with claim 1, wherein the second shielding of the adapter forms a plurality of grounding tabs located between the second tail portions of selected second contacts of the adapter.

3. A connector assembly including:
    a card connector comprising a first dielectric housing having a front end for receiving a card, a bottom face being mounted on a printed circuit board, an upper face opposite to the bottom face, and a rear end;
    a plurality of first contacts disposed within the first housing the first contacts having first tail portions extending from the first housing;
    a first metallic shielding attached to the first housing to cover at least the upper face of the first housing; and
    an adapter engageable with the rear end of the card connector and positioned on the same printed circuit board, said adapter including a second dielectric housing with a plurality of second contacts received therein, and a second metallic shielding covering the second housing; wherein the first shielding of the connector and the second shielding of the adapter are engaged with each other for shielding the first tail portions of the first contacts of the connector, the second shielding includes at least one grounding tab mechanically and electrically connected to the printed circuit board for reducing cross-talk between the second contacts, and the second shielding of the adapter forms a ridge fittingly received in a recess defined in the first shielding of the card connector.

4. The connector assembly in accordance with claim 3, wherein the first contacts and second contacts are coupled together in a horizontal direction.

5. The connector assembly in accordance with claim 3, wherein the grounding tab is positioned between tail portions of selected second contacts of the adapter.

* * * * *